(12) United States Patent
Frangioso, Jr. et al.

(10) Patent No.: US 7,445,457 B1
(45) Date of Patent: Nov. 4, 2008

(54) TECHNIQUES FOR CONNECTING MIDPLANE CONNECTORS THROUGH A MIDPLANE

(75) Inventors: Ralph C. Frangioso, Jr., Franklin, MA (US); Robert Wierzbicki, Worcester, MA (US); Michael L. Schillinger, Auburn, MA (US)

(73) Assignee: EMC Corporation, Hopkinton, MA (US)

( * ) Notice: Subject to any disclaimer, the term of this patent is extended or adjusted under 35 U.S.C. 154(b) by 0 days.

(21) Appl. No.: 11/862,761

(22) Filed: Sep. 27, 2007

(51) Int. Cl.
*H01R 12/00* (2006.01)
(52) U.S. Cl. .............................. 439/61; 361/805; 439/65
(58) Field of Classification Search ................... 439/61, 439/65; 361/788, 803, 805; 174/261, 262
See application file for complete search history.

(56) References Cited

U.S. PATENT DOCUMENTS

| | | | |
|---|---|---|---|
| 5,352,123 A * | 10/1994 | Sample et al. ................ 439/61 |
| 6,778,386 B2 | 8/2004 | Garnett et al. |
| 6,869,314 B2 | 3/2005 | Garnett et al. |
| 6,890,184 B2 * | 5/2005 | Doblar et al. ................ 439/65 |
| 7,068,500 B1 | 6/2006 | Beinor, Jr. et al. |
| 7,216,195 B1 | 5/2007 | Brown et al. |
| 7,240,154 B2 | 7/2007 | Frangioso et al. |
| 7,254,741 B1 | 8/2007 | Sardella et al. |
| 7,262,962 B1 | 8/2007 | McLeod et al. |
| 7,290,330 B2 | 11/2007 | Sardella et al. |
| 7,293,135 B1 | 11/2007 | Warnakulasooriya et al. |
| 7,295,446 B2 | 11/2007 | Crippen et al. |
| 7,320,609 B1 * | 1/2008 | Minich et al. .................. 439/79 |
| 7,362,572 B1 | 4/2008 | Wierzbicki et al. |
| 7,386,772 B1 | 6/2008 | Kozel et al. |

* cited by examiner

*Primary Examiner*—Tho D Ta
(74) *Attorney, Agent, or Firm*—BainwoodHuang

(57) ABSTRACT

A midplane has plated through holes (PTHs) which form a first profile and a second profile. The first profile has (i) an overlapping portion which overlaps at least part of the second profile and (ii) a non-overlapping portion which does not overlap any part of the second profile. A first connector mounts to a first side of the midplane over the first profile, and a second connector mounts to a second side of the midplane over the second profile. At least one PTH is a shared PTH which resides in both the first and second profiles and which engages a pin of the first connector and a pin of the second connector. Additionally, at least one PTH is a non-shared PTH which resides in the non-overlapping portion of the first profile and which engages a pin of the first connector without engaging any pins of the second connector.

25 Claims, 7 Drawing Sheets

TECHNIQUES FOR CONNECTING MIDPLANE CONNECTORS THROUGH A MIDPLANE

BACKGROUND

In general, a midplane is a circuit board which connects to other circuit boards on each side. Midplanes are often used in data storage systems where one side of the chassis accepts processing cards (e.g., storage processors) and the other side of the chassis accepts other types of cards such as I/O cards and service modules. Typically, power supplies connect to the midplane, and the midplane distributes power to the other circuit boards. Midplanes are suitable for use in other types of systems as well such as networking systems.

One conventional midplane has a portion that connects to a connector on each side. In particular, on a first side of this midplane portion, there is a first connector footprint which connects to a first midplane connector. On the opposite side of this midplane portion, there is a second connector footprint which perfectly overlaps the first connector footprint and which connects to a second midplane connector having the same design as the first midplane connector.

The midplane portion includes a group of plated through holes (PTHs) which are carefully arranged so that compression fit pins of the first connector insert into certain PTHs of the group through the first side of the midplane. Similarly, compression fit pins of the second connector insert into certain PTHs of the group through the second side. The midplane and the PTHs are deep enough so some of the PTHs, which are called "shared vias", receive pins through both ends without the pins interfering with each other. Such shared vias allow the two midplane connectors to connect with each other through the midplane without copper traces. The remaining PTHs of the group, which receive pins from only one connector, are connected to ground to improve signal integrity of the signals passing through the shared vias. Connectors which are similar to the above-described connectors are the I-Trac™ connectors offered by Molex Incorporated of Lisle, Ill.

SUMMARY

Unfortunately, there are deficiencies to the above-described conventional midplane which has two perfectly overlapping connector footprints to connect midplane connectors having the same design through shared vias. In particular, with the two perfectly overlapping connector footprints of the conventional midplane, there is not very much flexibility in terms of choosing PTHs to carry signals to only one connector.

For example, suppose that a midplane designer wishes to employ the above-described conventional midplane configuration but further wishes to provide an extra signal to only the midplane connector on the first side of the midplane but not the midplane connector on the second side of the midplane. Such a situation may exist if there is a particular non-shared signal that has to only go to one of the circuit boards, i.e., a circuit board on one side of the midplane needs the signal, but the circuit board on the other side of the midplane does not need the signal. Unfortunately, the designer must send the signal through a PTH within both footprints since the footprints for the two connectors perfectly overlap. That is, the designer is unable to isolate the signal from the footprint for the second connector. Moreover, the high density of PTHs within the overlapping footprints may restrict the midplane designer's and midplane manufacturer's ability to run traces to the PTHs near the center of the connector footprints due to the small pitch spacings between the PTHs. Additionally, the PTHs, which carry signals from the midplane to only one circuit board, are shared vias which connect to connector pins on both sides thus increasing stub length and reducing signal quality/performance for those signals.

To resolve the above-described dilemmas, the midplane designer and midplane manufacturer could provide another footprint for another connector to move the extra non-shared signal to the circuit board that needs it. That is, the midplane designer could run traces to another connector footprint to locate an extra connector on one side of the midplane. However, this would greatly increase costs (i.e., another connector to buy and install) as well as greatly consume midplane and circuit board real estate.

In contrast to the above-described conventional midplane which has two perfectly overlapping connector footprints to connect connectors having the same design through shared vias, an improved midplane assembly utilizes profiles (or connector footprints) of PTHs which do not perfectly overlap. Such an improved midplane assembly is capable of employing identical midplane connectors on each side of the midplane (i.e., connectors having identical pin layouts) but with the identical midplane connectors partially offset from each other. Such an improved midplane assembly is alternatively capable of employing non-identical midplane connectors (i.e., connectors having different pin layouts). For these improved midplane assemblies, there is a PTH profile having at least one PTH which is shared thus providing convenience, performance and density (e.g., there is no needed etch for that PTH). However, the PTH profile also has at least one PTH which is non-shared and that resides in a non-overlapping portion of the PTH profile to engage a pin of one connector on one side of the midplane without engaging any pins of the other connector on the other side of the midplane. Such techniques provide improved flexibility and connectivity options to the midplane designer and the midplane manufacturer.

One embodiment is directed to a midplane assembly which includes a midplane having dielectric material and a set of PTHs supported by the dielectric material. The PTHs are arranged within the dielectric to form a first profile and a second profile. The first profile has (i) an overlapping portion which overlaps at least part of the second profile and (ii) a non-overlapping portion which does not overlap any part of the second profile. The midplane assembly further includes a first connector arranged to mount to a first side of the midplane over the first profile, and a second connector arranged to mount to a second side of the midplane over the second profile. At least one PTH is a shared PTH which resides in both the first and second profiles and which engages a pin of the first connector and a pin of the second connector. Additionally, at least one PTH is a non-shared PTH which resides in the non-overlapping portion of the first profile and which engages a pin of the first connector without engaging any pins of the second connector.

BRIEF DESCRIPTION OF THE DRAWINGS

The foregoing and other objects, features and advantages will be apparent from the following description of particular embodiments of the invention, as illustrated in the accompanying drawings in which like reference characters refer to the same parts throughout the different views. The drawings are not necessarily to scale, emphasis instead being placed upon illustrating the principles of various embodiments of the invention.

DETAILED DESCRIPTION

An improved midplane assembly utilizes profiles (or connector footprints) of plated through holes (PTHs) which do not perfectly overlap. Such an improved midplane assembly is capable of employing identical connectors on each side of the midplane (i.e., connectors having identical pin layouts) but with the identical connectors partially offset from each other. Such an improved midplane assembly is alternatively capable of employing non-identical connectors (i.e., connectors having different pin layouts). For these improved midplane assemblies, there is a PTH profile having at least one PTH which is shared thus providing the convenience of no needed etch for that PTH. However, the PTH profile also has at least one PTH which is non-shared and that resides in a non-overlapping portion of the profile to engage a pin of one connector on one side of the midplane without engaging any pins of the other connector on the other side of the midplane. Such techniques provide improved flexibility and performance to the midplane designer and the midplane manufacturer.

Figure 1:
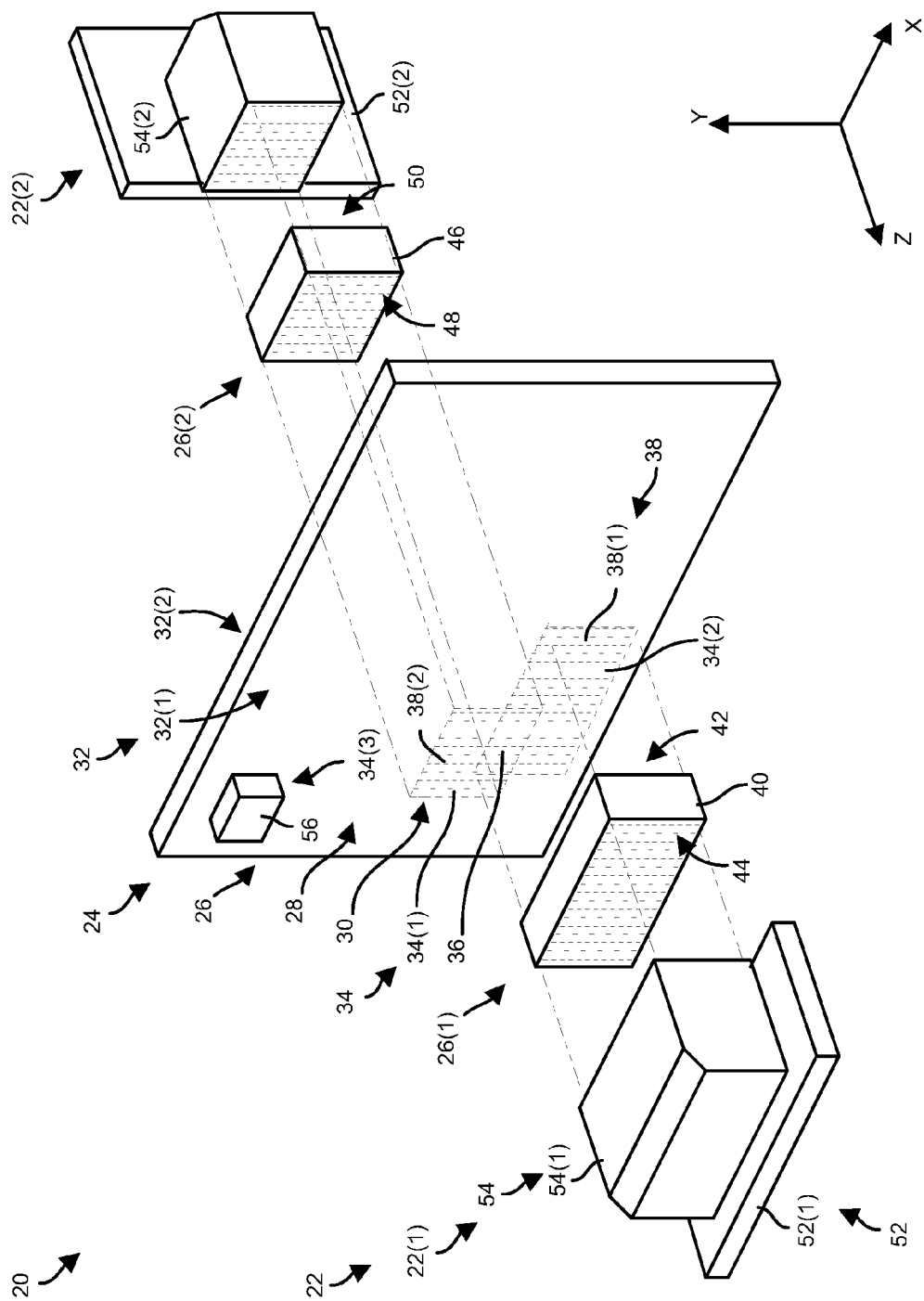
FIG. 1 is a perspective view of an electronic system which includes a midplane with a connector footprint having an overlapping portion with at least one shared plated through hole (PTH), and a non-overlapping portion with at least one non-shared PTH.

FIG. 1 shows an electronic system 20 having circuit board modules 22(1), 22(2) (collectively, circuit board modules 22) and a midplane assembly 24 which interconnects the circuit board modules 22. The midplane assembly 24 includes a midplane 26 having dielectric material 28 and a set of PTHs 30 supported by the dielectric material 28. The dielectric material defines a first side 32(1) and a second side 32(2) of the midplane 26, which extends along the X-Y plane in FIG. 1. Preferably the midplane 26 is a multi-layered circuit board with multiple dielectric layers and multiple signal layers.

The set of PTHs 30 is arranged within the dielectric 28 to form a first profile 34(1) of PTHs 30 and a second profile 34(2) of PTHs 30. The shape and size of the profiles 34(1), 34(2) (collectively, profiles 34) are determined by the two-dimensional shapes (e.g., component outlines or silhouettes) in the X-Y plane that are formed by the PTHs 30. Each profile 34 is essentially the mounting location, or component footprint, of a midplane component since it mirrors the connecting side of the corresponding component. That is, the periphery of each profile 34 mirrors the periphery of the midplane component that mounts to that profile 34. As will be explained in further detail shortly, the first profile 34(1) has an overlapping portion 36 which overlaps at least part of the second profile 34(2) and a non-overlapping portion 38(1) which does not overlap any part of the second profile 34(2). The second profile 34(2) may have a non-overlapping portion 38(2) as well.

The midplane assembly 24 further includes a first midplane connector 40 having a midplane interface 42 (in the X-Y plane) which mounts to the first side 32(1) of the midplane 26 over the first profile 34(1), and a module interface 44 (in the X-Y plane) which is arranged to connect with the circuit board module 22(1). Similarly, the midplane assembly 24 further includes a second midplane connector 46 having a midplane interface 48 which mounts to the second side 32(2) of the midplane 26 over the second profile 34(2), and a module interface 50 which is arranged to connect with the circuit board module 22(2). In some arrangements, the midplane connectors 40, 46 are identical in design. In other arrangements, the midplane connectors 40, 46 are not identical in design (e.g., they have different pin layouts, different sizes, or different shapes, etc.).

It should be understood that each circuit board module 22 preferably includes a circuit board 52 and a module connector 54 mounted to that circuit board 52. In particular, the circuit board module 22(1) includes a circuit board 52(1) and a module connector 54(1) which is mounted to the circuit board 52(1). As shown in FIG. 1, the connector 54(1) is arranged to connect to the module interface 44 of the midplane connector 40. Likewise, the circuit board module 22(2) includes a circuit board 52(2) and a module connector 54(2) which is mounted to the circuit board 52(2). Furthermore, the module connector 54(2) is arranged to connect to the module interface 50 the midplane connector 46.

It should be further understood that the midplane 26 may include other sets of PTHs or metallic circuit board structures for mounting other circuit board components as well (e.g., power supplies, display boards, etc.). To illustrate this, another component 56 is shown mounted to another profile 34(3) of PTHs 30.

Both midplane connectors 40, 46 are high-density, substantially block-shaped, electrical circuit board connectors. Similarly, both module connectors 54 are high-density electrical circuit board connectors with substantially rectangular connecting interfaces. A series of connectors which are suitable for use as the midplane connectors 40, 46 and the module connectors 54 are the I-Trac™ connectors offered by Molex Incorporated of Lisle, Ill.

By way of example only, the connector 54(1) has a different design than the connector 54(2) (i.e., a different size, shape, or pin layout). Such a situation may exist particularly when the module 22(1) and the module 22(2) are designed to perform different functions. For example, the module 22(1) may be a motherboard or processing module of the electronic system 20. In contrast, the module 22(2) may be an input/output (I/O) adapter or other peripheral device (e.g., a daughter card, a disk drive, a memory board, etc.) of the electronic system 20. Further details will now be provided with reference to FIG. 2.

Figure 2:
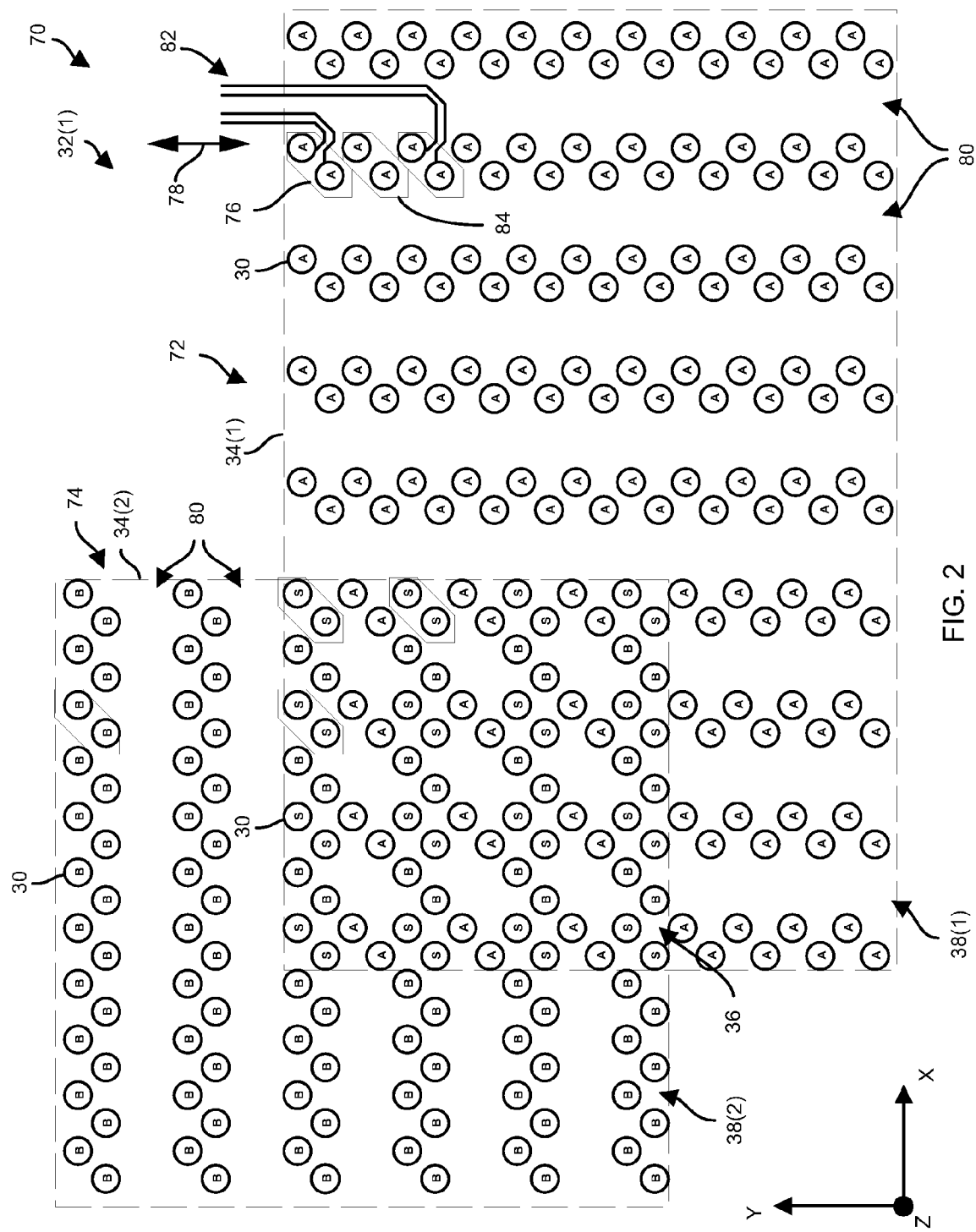
FIG. 2 is a detailed view of a portion of the midplane from a first side.

FIG. 2 is a view of an area 70 on the side 32(1) of the midplane 26. Such a view can be seen from the perspective of the midplane connector 40 and the circuit board module 22(1) facing the side 32(1) of the midplane 26 (also see FIG. 1). As shown, the PTH profile 34(1) is substantially rectangular in shape to mirror the rectangular shape of the rectangular connecting side of the midplane connector 40 (also see the midplane interface 42 in FIG. 1). Similarly, the PTH profile 34(2) is substantially rectangular in shape to mirror the rectangular shape of the rectangular connecting side of the midplane connector 46 (also see the midplane interface 48 in FIG. 1).

The PTH profile 34(1) includes a PTH layout 72 formed by eighteen (18) columns and twenty-two (22) rows of PTHs 30 by way of example only. The rows of the layout 72 are considered to extend along the X-axis in FIG. 2 to mirror the particular orientation of the midplane connector 40 (FIG. 1). The direction of the rows and columns is capable of being determined by certain reference features of the midplane connector 40 such as by align grooves along the connector body, an alignment pin, and so on.

In contrast and also by way of example only, the PTH profile 34(2) includes a PTH layout 74 formed by twelve (12) columns and twenty-two (22) rows of PTHs 30. The rows of the layout 74 are considered to extend along the Y-axis in FIG. 2 to mirror the orientation of the midplane connector 46 which is orthogonal with respect to the midplane connector 40.

It should be understood that the PTH profile 34(1) (i.e., the outer periphery of the footprint generally formed by the layout 72 of PTHs 30 connecting to the midplane connector 40) has a different shape and different size than those of the PTH profile 34(2) by way of example only. In other arrangements the PTH profiles 34(1), 34(2) have the same shape and size.

It should be further understood that the placement of PTHs 30 within the layouts 72, 74 are so that pairs 76 of PTHs 30 are well-configured to for high speed signaling. In particular, both the overlapping portion 36 and non-overlapping portions 38 are arranged to carry differential mode signals. To this end, columns of PTHs 30 are paired tightly together so that an adjacent PTH 30 from each paired column forms a differential pair 76 for carrying a differential mode signal 78. Preferably, the individual PTHs 30 of each differential pair 76 are offset at a 45 degree angle to the rows and columns (i.e., at a 45 degree angle to the X and Y axes) to enable very close PTH placement to maintain tight coupling between lines of the differently signal pathways. Additionally, gaps 80 reside between the paired columns to allow space for differential signal traces 82 (e.g., see the profile 34(1) in FIG. 2). Furthermore, particular PTH pairs 84 can be designated for ground to provide improved isolation between differential pairs 76. Such PTH placement results in a row pitch that is different than the column pitch. At this point, further details of the profile overlapping and non-overlapping features of the profiles 34 will be provided.

As shown in FIG. 2, the profile 34(1) of PTHs 30 has an overlapping portion 36 which overlaps at least part of the profile 34(2), and a non-overlapping portion 38(1) which does not overlap any part of the profile 34(2) (also see FIG. 1). In a like manner, the profile 34(2) has the same overlapping portion 36 which overlaps at least part of the profile 34(1), and a non-overlapping portion 38(2) which does not overlap any part of the profile 34(1).

As further shown in FIG. 2, at least one PTH 30 is a "shared PTH" which engages both a pin of the first midplane connector 40 and a pin of the second midplane connector 46. These shared PTHs are designated with the letter "S" and reside in the overlapping portion 36 of both profiles 34(1), 34(2). Such shared PTHs 30 do not require any copper traces within the midplane 26 when conveying signals between the midplane connectors 40, 46. Rather, the signals (e.g., differential signals 78) simply pass between the pins of the midplane connector 40, the shared PTHs 30, and the pins of the midplane connector 46.

Additionally, and as further shown in FIG. 2, some PTHs 30 engage pins of the first midplane connector 40 but no pin of the second midplane connector 46. These non-shared PTHs 30 are designated with the letter "A" and reside in the overlapping portion 36 of both profiles 34(1), 34(2) as well as the non-overlapping portion 38(1) of the profile 34(1).

In a similar manner, some PTHs 30 engage pins of the second midplane connector 44 but no pin of the first midplane connector 40. These non-shared PTHs 30 are designated with the letter "B" and reside in the overlapping portion 36 of both profiles 34(1), 34(2) as well as the non-overlapping portion 38(2) of the profile 34(2).

An advantage of the non-shared PTHs within the overlapping portion 36 of the profiles 34 is that they can connected to near side ground references for enhanced signal isolation of the other PTHs. For example, certain PTHs labeled "A" within the overlapping portion 36 can connect to the local ground of the midplane connector 40 and the ground of the circuit board module 22(1). Similarly, certain PTHs labeled "B" within the overlapping portion 36 can connect to the local ground of the midplane connector 46 and the ground of the circuit board module 22(2).

Furthermore, an advantage of the non-shared PTHs in the non-overlapping portions 38(1), 38(2) (collectively, non-overlapping portions 38) of the profiles is that they can carry signals exclusively to only one midplane connector 40, 46 and only one circuit board module 22 without any interference from the other midplane connector 40, 46 and other circuit board module 22. In particular, there is no extended stub from a pin of the other connector which would otherwise reduce high speed signal performance since the PTHs 30 in the non-overlapping portions 38 are not shared. For example, certain PTHs 30 labeled "A" within the non-overlapping portion 38(1) can carry differential mode signals 78 to and from other locations of the midplane 26, and such PTHs 30 enjoy robust signal trace space 80 (e.g., see the traces 82 in FIG. 2) which is not restricted by PTHs 30 of the other profile 34(2). In the same way, certain PTHs 30 labeled "B" within the non-overlapping portion 38(2) can carry differential mode signals 78, and such PTHs 30 enjoy robust signal trace space 80 which is not restricted by PTHs 30 of the other profile 34(1).

Additionally, power delivery can occur to the specific modules through the non-overlapping portions 38(1), 38(2) thus saving the need and cost of separate power connectors. Further details will now be provided with reference to FIG. 3.

Figure 3:
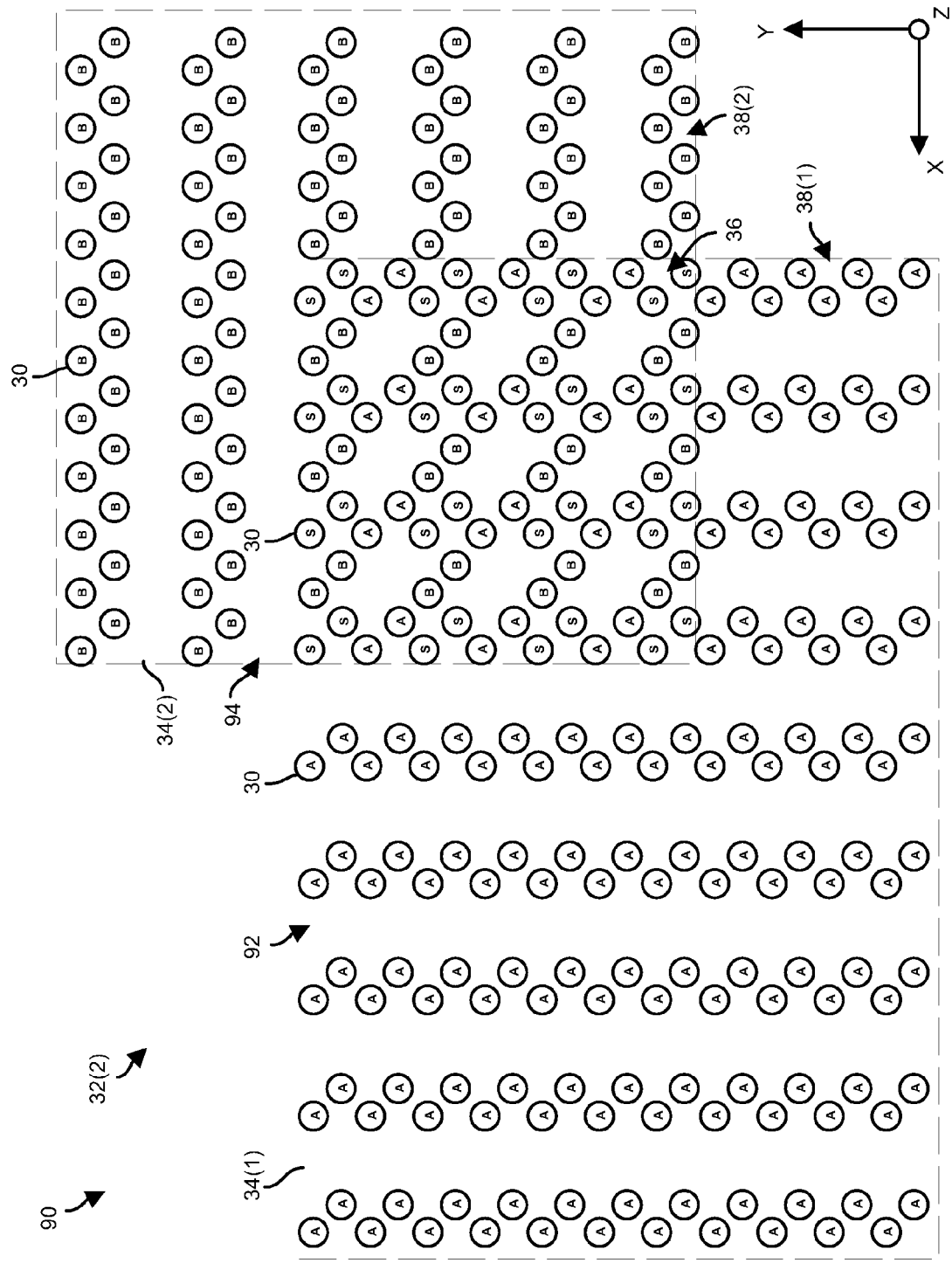
FIG. 3 is a detailed view of the portion of the midplane from a second side.

FIG. 3 is a view of an area 90 on the side 32(2) of the midplane 26. Such a view can be seen from the perspective of the midplane connector 46 and the circuit board module 22(2) facing the side 32(2) of the midplane 26 (also see FIG. 1).

In FIG. 3, the layout 92 corresponds with the layout 72 on the side 32(1) of the midplane 26. However, the layout 92 is the mirror image of the layout 72 since the PTHs 30 penetrate entirely through the dielectric material 28 from the midplane side 32(1) through to the midplane side 32(2). Similarly, the layout 94 corresponds with the layout 74 on the side 32(1) of the midplane 26, but the layout 94 is the mirror image of the layout 74.

As shown in FIG. 3, the profile 34(1) still includes the overlapping portion 36 which overlaps at least part of the profile 34(2), and the non-overlapping portion 38(1) which does not overlap any part of the profile 34(2). Likewise, the profile 34(2) still includes the same overlapping portion 36 which overlaps at least part of the profile 34(1), and the non-overlapping portion 38(2) which does not overlap any part of the profile 34(1).

Additionally, the overlapping portion 36 includes shared PTHs 30 which are labeled with the letter "S", non-shared PTHs 30 which are used only by the pins of midplane connector 40 and which are labeled with the letter "A", and non-shared PTHs 30 which are used only by the pins of midplane connector 46 and which are labeled with the letter "B". The non-overlapping portion 38(1) includes only non-shared PTHs 30 which are labeled with the letter "A" and which are used by the pins of the midplane connector 40. Similarly, non-overlapping portion 38(1) includes only non-shared PTHs 30 which are labeled with the letter "B" and which are used by the pins of the midplane connector 46. Further details will now be provided with reference to FIGS. 4 and 5.

Figure 4:
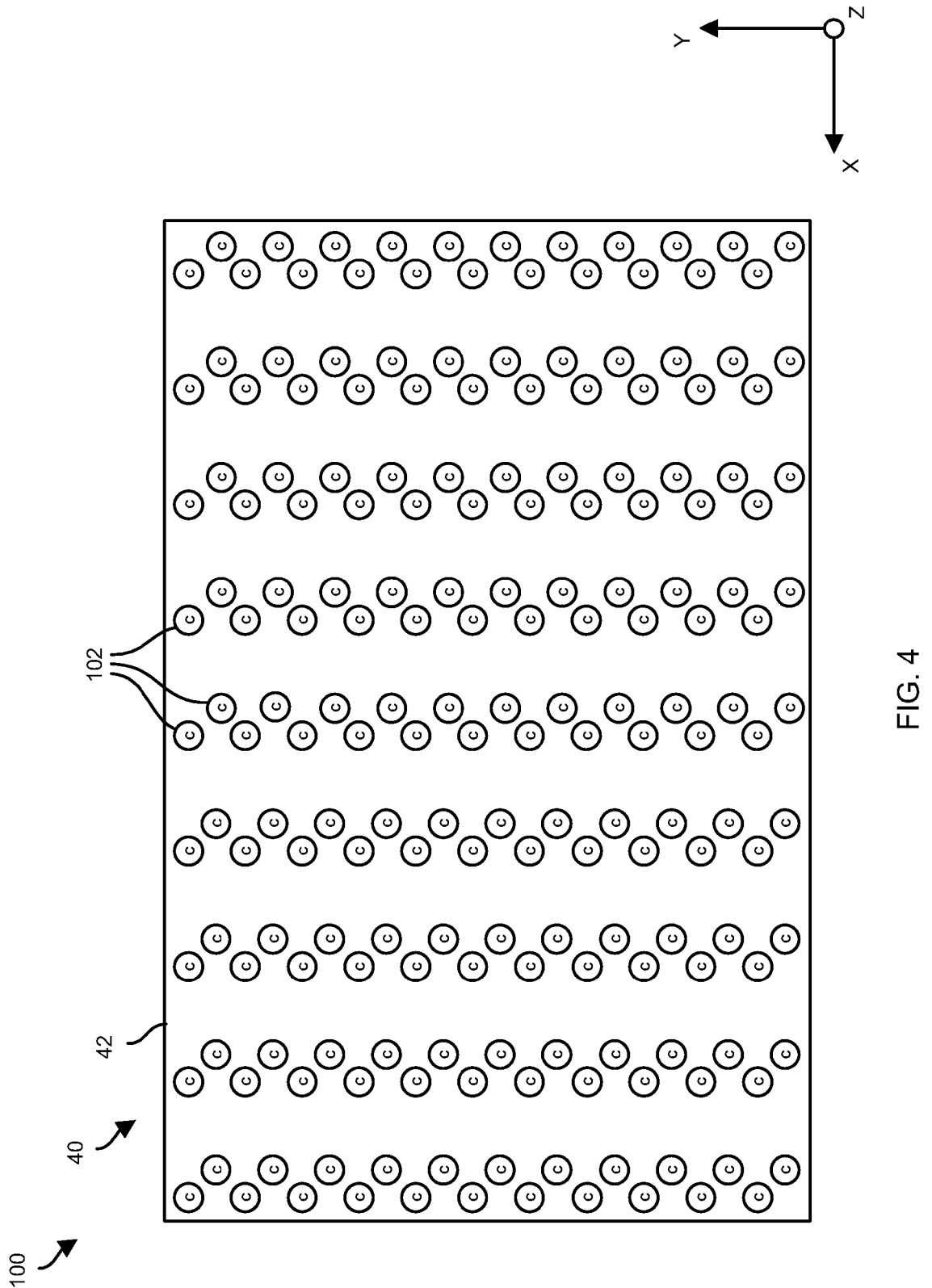
FIG. 4 is a detailed view of a layout of a midplane connector arranged to connect to the portion of the midplane over the first side.

FIG. 4 is a detailed view of a pin layout 100 for the midplane interface 42 of the midplane connector 40. The pin layout 100 includes rows and columns of pins 102 which are positioned to properly align with the PTHs of the profile 34(1) (also see FIGS. 1 and 2). The pin layout 100 is formed by eighteen (18) columns and twenty-two (22) rows of pins 102 by way of example only. The rows of the layout 100 are considered to extend along the X-axis in FIG. 4 thus matching the particular orientation of the layout 72 of the PTH profile 34(1) in FIG. 2 for proper connectivity. The pins 102 are labeled with the letter "C" to indicate that all of the pins 102 belong to the midplane interface 42 of the midplane connector 40. Accordingly, some pins 102 of the midplane interface 42 will engage shared PTHs labeled "S", and non-shared PTHs labeled "A" in FIG. 2.

In some arrangements, the pins 102 are compliant pins that enable the midplane connector 40 to cleanly engage the PTHs 30 of the profile 34(1) when the connector 40 mounts to the side 32(1) of the midplane 26 over the profile 34(1). Compression fit structures such as bifurcated pins, eye-of-the-needle pins, and the like, are suitable for use as the pins 102.

Figure 5:
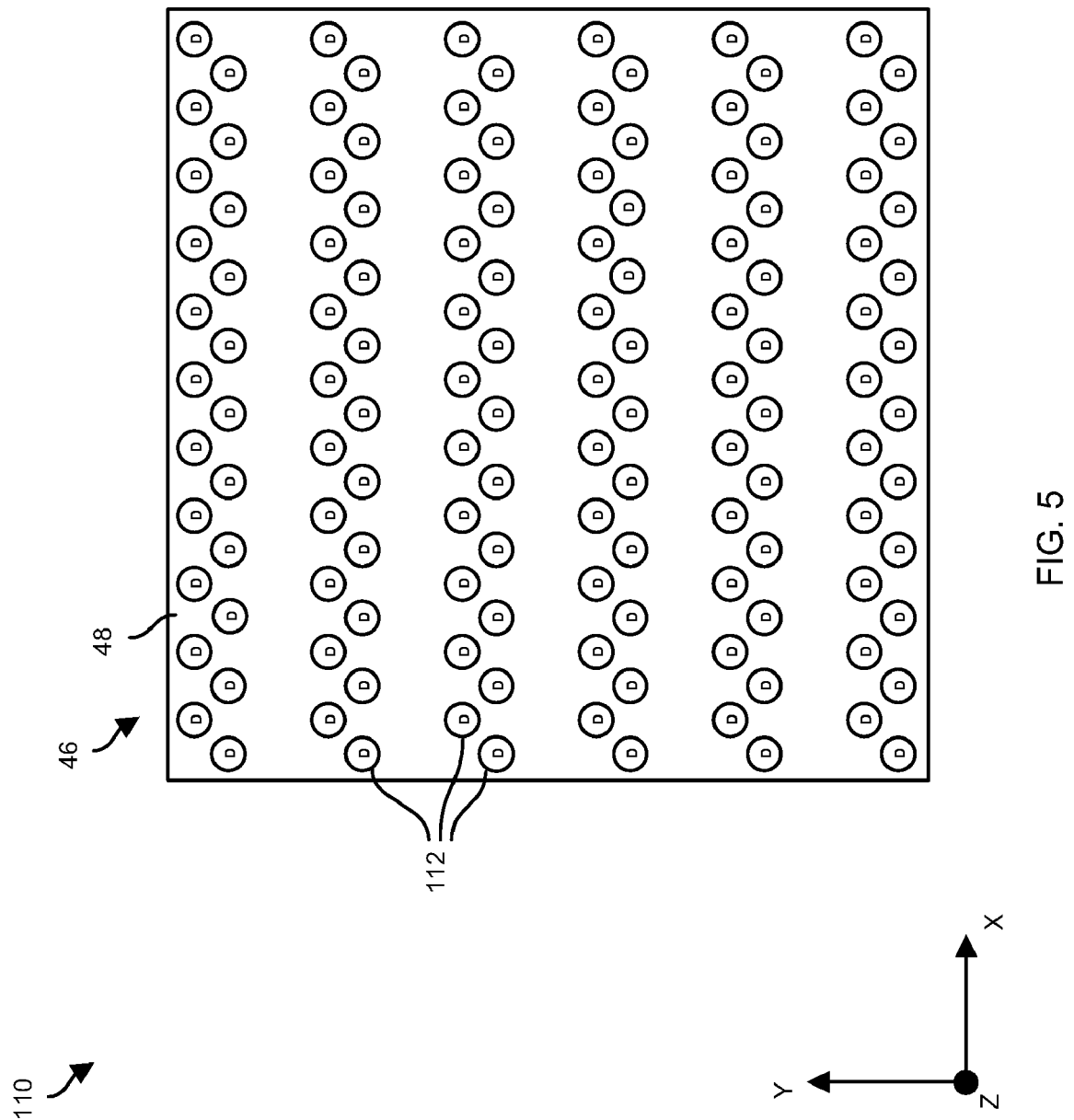
FIG. 5 is a detailed view of a layout of another midplane connector arranged to connect to the portion of the midplane over the second side.

FIG. 5 is a detailed view of a pin layout 110 for the midplane interface 48 of the midplane connector 46. The pin layout 110 includes rows and columns of pins 112 which are positioned to properly align with the PTHs of the profile 34(2) (also see FIGS. 1 and 3). The pin layout 110 is formed by twelve (12) columns and twenty-two (22) rows of pins 112. The rows of the layout 110 are considered to extend along the Y-axis in FIG. 5 thus matching the particular orientation of the layout 94 of the PTH profile 34(2) in FIG. 3 for proper connectivity. The pins 112 are labeled with the letter "D" to indicate that all of the pins 112 belong to the midplane interface 48 of the midplane connector 46. Some pins 112 of the midplane interface 48 will engage shared PTHs labeled "S", and some pins 112 will engage the non-shared PTHs labeled "B" in FIG. 3.

In some arrangements, the pins 112 are compliant pins that enable the midplane connector 46 to cleanly engage the PTHs 30 of the profile 34(2) when the connector 40 mounts to the side 32(2) of the midplane 26 over the profile 34(2). Again, compression fit structures such as bifurcated pins, eye-of-the-needle pins, and the like, are suitable for use as the pins 112. Further details will now be provided with reference to FIG. 6.

Figure 6:
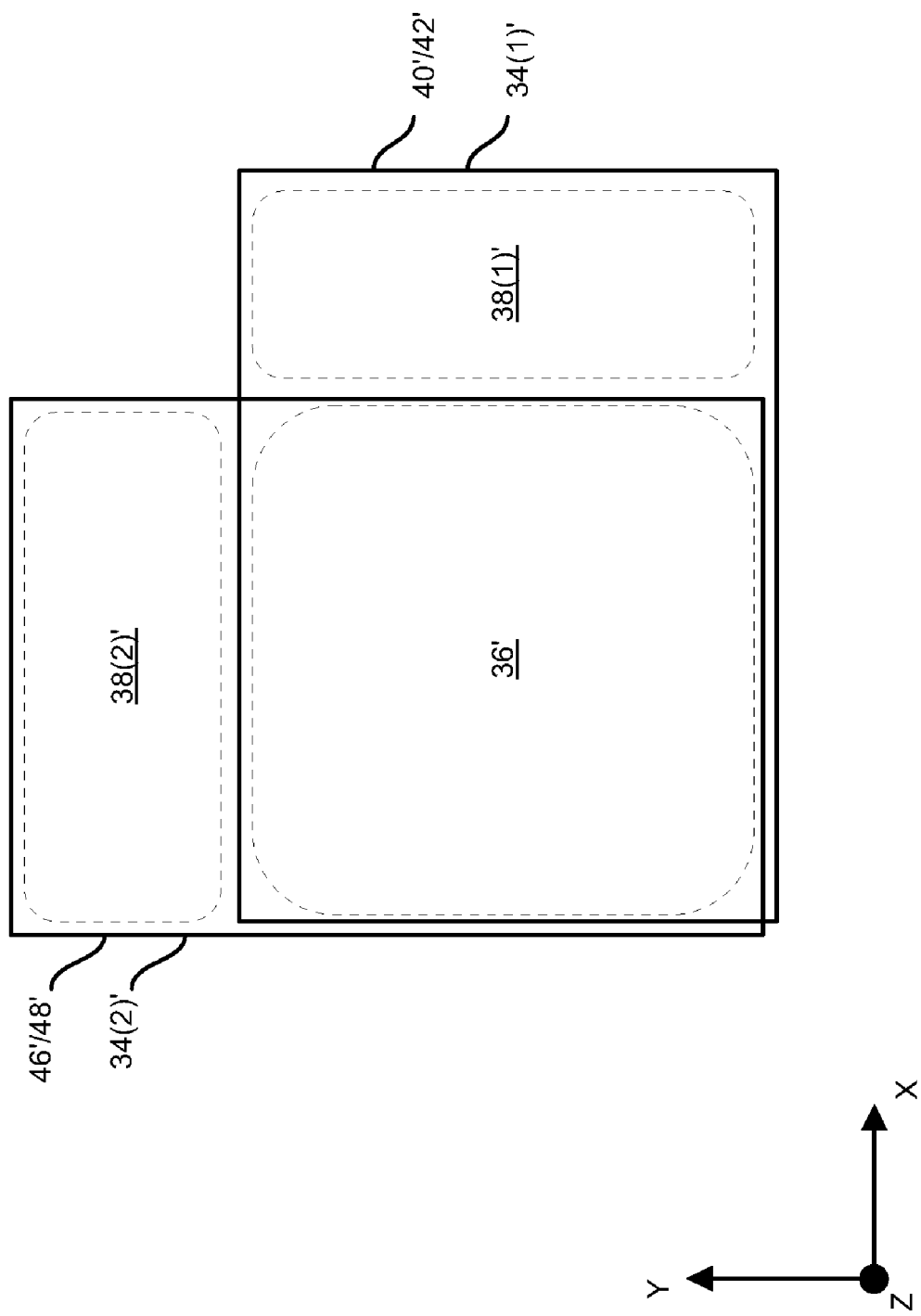
FIG. 6 is a view of a general arrangement of PTH profiles which is an alternative to that shown in FIG. 2.

FIG. 6 is a view of an alternative arrangement for the layouts for alternative PTH profiles 34(1)', 34(2)' of the midplane 26, and for the pin layouts for alternative midplane interfaces 42', 48' of midplane connectors 40", 46' (also see the midplane connectors 40, 46 in FIG. 1). The purpose of FIG. 6 is to show an arrangement which uses connectors 40', 46' of the same design (i.e., the same size, shape, etc.) rather than different designs. It should be understood that, for simplicity, the individual PTHs 30 of the PTH profiles 34(1)', 34(2)' and the individual pins of the midplane interfaces are omitted, and that only the PTH profiles 34(1)', 34(2)' and outlines of the midplane interfaces 42', 48' are shown in FIG. 6.

As shown in FIG. 6, the shapes and sizes of the midplane interfaces 42', 48' are the same and enable the midplane connectors 40', 46' to have the same design. The situation shown in FIG. 6 arises when the midplane interface 42' of the midplane connector 40' connects to the profile 34(1)' of the midplane 26 by moving the midplane connector 40' in the negative Z-direction toward the first side 32(1)' of the midplane 26 (also see FIG. 1). Likewise, the midplane interface 48' of the midplane connector 46' connects to the profile 34(2)' of the midplane 26 by moving the midplane connector 46' in the positive Z-direction toward the first side 32(2)' of the midplane 26 (again, also see FIG. 1).

As further shown in FIG. 6, there is an overlapping region 36' (demarcated by the dashed lines) within which (i) shared PTHs 30 reside (see the PTHs labeled "S" in FIG. 2), (ii) non-shared PTHs 30 which connect only to the midplane connector 40' reside (see the PTHs labeled "A" in FIG. 2), and (iii) non-shared PTHs 30 which connect only to the midplane connector 46' reside (see the PTHs labeled "B" in FIG. 2). Accordingly, the overlapping region 36' provides high-density pass through connections between the connectors 40', 46' (e.g., for differential signals) as well as the ability to achieve reliable isolation (e.g., with certain PTHs connected to ground by one connector or the other).

In contrast, the non-overlapping region 38(1)' includes only non-shared PTHs 30 which connect only to the midplane connector 40'. Similarly, the non-overlapping region 38(2)' includes only non-shared PTHs 30 which connect only to the midplane connector 46'. With the density of PTHs 30 within the non-overlapping regions 38(1)', 38(2)' being lower than that within the overlapping region 36", the PTHs 30 within the non-overlapping regions 38(1)', 38(2)' there is ample space to robustly and reliably run traces (e.g., differential pairs) to the PTHs 30 from locations outside the profiles to the PTHs 30 in the non-overlapping regions 38(1)', 38(2)'. Further details will now be provided with reference to FIG. 7.

Figure 7:
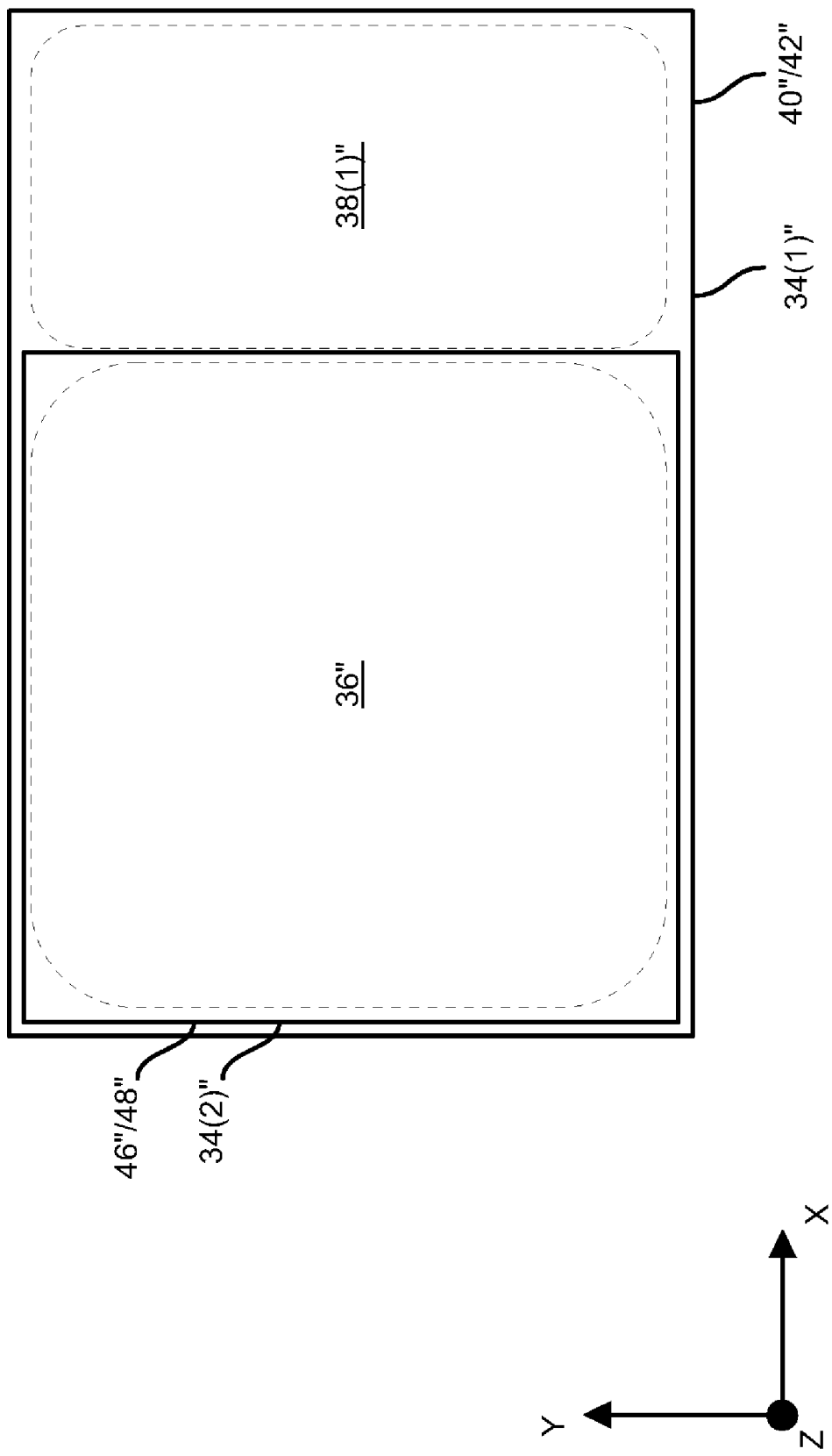
FIG. 7 is a view of another general arrangement of PTH profiles which is an alternative to that shown in FIGS. 2 and 6.

FIG. 7 is a view of yet another alternative arrangement for the layouts for alternative PTH profiles 34(1)", 34(2)" of the midplane 26, and for the pin layouts for alternative midplane interfaces 42", 48" of midplane connectors 40", 46" (also see FIG. 1). The purpose of FIG. 7 is to show an arrangement in which the profile 34(1)" for one connector 40" completely overlaps the profile 34(2)" for another connector 46". Again, it should be understood that, for simplicity, the individual PTHs 30 of the PTH profiles 34(1)", 34(2)" and the individual pins of the midplane interfaces are omitted, and that only the PTH profiles 34(1)", 34(2)" and outlines of the midplane interfaces 42", 48" are shown in FIG. 7.

The situation shown in FIG. 7 arises when the midplane interface 42" of the midplane connector 40" connects to the profile 34(1)" of the midplane 26 by moving the midplane connector 40' in the negative Z-direction toward the first side 32(1)" of the midplane 26 (also see FIG. 1). Likewise, the midplane interface 48" of the midplane connector 46" connects to the profile 34(2)' of the midplane 26 by moving the midplane connector 46" in the positive Z-direction toward the first side 32(2)" of the midplane 26 (again, also see FIG. 1).

As further shown in FIG. 7, there is an overlapping region 36" (demarcated by the dashed lines) within which (i) shared PTHs 30 reside (see the PTHs labeled "S" in FIG. 2), (ii) non-shared PTHs 30 which connect only to the midplane connector 40" reside (see the PTHs labeled "A" in FIG. 2), and (iii) non-shared PTHs 30 which connect only to the midplane connector 46" reside (see the PTHs labeled "B" in FIG. 2). Accordingly, the overlapping region 36" provides high-density pass through connections between the connectors 40", 46" (e.g., for differential signals) as well as the ability to achieve reliable isolation (e.g., with certain PTHs connected to ground by one connector or the other).

In contrast, the non-overlapping region 38(1)" includes only non-shared PTHs 30 which connect only to the midplane connector 40". There is no non-overlapping region for the midplane connector 46". Nevertheless, the density of PTHs 30 within the non-overlapping region 38(1)" is lower than that within the overlapping region 36". Accordingly, there is ample space for robustly and reliably running traces (e.g., differential pairs) to the PTHs 30 from locations outside the profiles to the PTHs 30 in the non-overlapping region 38(1) which connect to the pins of the midplane connector 40". Such a configuration is well-suited when only one module (e.g., the circuit board module 22(1) in FIG. 1) requires extra connectivity to the midplane 26 (e.g., environmental monitoring signals, extra power supply signals, etc.).

As described above, an improved midplane assembly 24 utilizes profiles (or connector footprints) of PTHs 30 which do not perfectly overlap. Such an improved midplane assembly 24 is capable of employing identical midplane connectors 40', 46' on each side 32(1), 32(2) of the midplane 26 (i.e., connectors having identical pin layouts) but with the identical midplane connectors 40', 46' partially offset from each other. Such an improved midplane assembly is alternatively capable of employing non-identical midplane connectors 40, 46, 40", 46" (i.e., connectors having different pin layouts). For these improved midplane assemblies 24, there is a PTH profile having at least one PTH 30 which is shared thus providing convenience, performance and density (e.g., there is no needed etch for that PTH 30). However, the PTH profile also has at least one PTH 30 which is non-shared and that resides in a non-overlapping portion of the PTH profile to engage a pin of one connector on one side of the midplane 26 without engaging any pins of the other connector on the other side of the midplane 26. Such techniques provide improved flexibility to the midplane designer and the midplane manufacturer.

While various embodiments of the invention have been particularly shown and described, it will be understood by those skilled in the art that various changes in form and details may be made therein without departing from the spirit and scope of the invention as defined by the appended claims.

For example, it should be understood that the midplane 26 can include different combinations of partially-overlapping or not perfectly overlapping PTH profiles. In particular, FIG. 2 shows a connecting pattern in which connectors 40, 46 having different designs (i.e., different sizes, difference shapes, different pin layouts, etc.) connect through PTH profiles 34(1), 34(2) that are partially-overlapping. FIG. 6 shows a connecting pattern in which connectors 40', 46' having the same design (i.e., the same size, the same shape, the same pin layout, etc.) connect through PTH profiles 34(1)', 34(2)' that are only partially-overlapping. FIG. 7 shows a connecting pattern in which connectors 40", 46" having different designs connect through PTH profiles 34(1)", 34(2)" in which the profile 34(1)" completely overlaps the profile 34(2)". In some arrangements, the midplane 26 includes multiple instances of the profiles shown in FIG. 2, multiple instances of the profiles shown in FIG. 6, multiple instances of the profiles shown in FIG. 7, conventional PTH footprints, and/or combinations thereof, etc. to form an electronic system 20 having a high density of modules 22 with great connecting alternatives.

Additionally, it should be understood that the PTHs 30 were described above as being set at 45 degrees from the column and row axes by way of example only. In other arrangements, the PTHs 30 are not at 45 degrees but are in line with the column and row axes. Such modifications and enhancements are intended to belong to various embodiments of the invention.

What is claimed is:

1. A midplane assembly, comprising:
   a midplane having dielectric material and a set of plated through holes supported by the dielectric material, the dielectric material substantially defining a first side and a second side of the midplane, the set of plated through holes being arranged within the dielectric to form a first profile of plated through holes and a second profile of plated through holes, the first profile of plated through holes having (i) an overlapping portion which overlaps at least part of the second profile of plated through holes and (ii) a non-overlapping portion which does not overlap any part of the second profile of plated through holes;
   a first connector arranged to mount to the first side of the midplane over the first profile of plated through holes; and
   a second connector arranged to mount to the second side of the midplane over the second profile formed by the set of plated through holes;
   at least one plated through hole of the set of plated through holes being a shared plated through hole which resides in both the first and second profiles and which engages a pin of the first connector and a pin of the second connector; and
   at least one plated through hole of the set of plated through holes being a non-shared plated through hole which resides in the non-overlapping portion of the first profile and which engages a pin of the first connector without engaging any pins of the second connector.

2. A midplane assembly as in claim 1 wherein a shape of the first profile of plated through holes mirrors a shape of a connecting side of the first connector; and
   wherein a shape of the second profile of plated through holes mirrors a shape of a connecting side of the second connector.

3. A midplane assembly as in claim 2 wherein the each of the first and second profiles is substantially rectangular in shape.

4. A midplane assembly as in claim 3 wherein at least one plated through hole of the set of plated through holes is a non-shared plated through hole which resides in both the first and second profiles and which engages a pin of the first connector without engaging any pins of the second connector.

5. A midplane assembly as in claim 3 wherein at least one plated through hole of the set of plated through holes is a non-shared plated through hole which resides in both the first and second profiles and which engages a pin of the second connector without engaging any pins of the first connector.

6. A midplane assembly as in claim 3 wherein the second profile of plated through holes has (i) an overlapping portion which overlaps at least part of the first profile of plated through holes and (ii) a non-overlapping portion which does not overlap any part of the first profile of plated through holes; and
   wherein at least one plated through hole of the set of plated through holes is a non-shared plated through hole which resides in the non-overlapping portion of the second profile and which engages a pin of the second connector without engaging any pins of the first connector.

7. A midplane assembly as in claim 3 wherein at least one plated through hole of the set of plated through holes is a non-shared plated through hole which resides in both the first and second profiles and which engages a pin of the first connector without engaging any pins of the second connector;
   wherein at least one plated through hole of the set of plated through holes is a non-shared plated through hole which resides in both the first and second profiles and which engages a pin of the second connector without engaging any pins of the first connector;
   wherein the second profile of plated through holes has (i) an overlapping portion which overlaps at least part of the first profile of plated through holes and (ii) a non-overlapping portion which does not overlap any part of the first profile of plated through holes; and wherein at least one plated through hole of the set of plated through holes is a non-shared plated through hole which resides only in the second profile without residing in the first profile and which engages a pin of the second connector without engaging any pins of the first connector.

8. A midplane assembly as in claim 3 wherein the connecting side of the first connector and the connecting side of the second connector have a same pin layout.

9. A midplane assembly as in claim 3 wherein the connecting side of the first connector and the connecting side of the second connector have different pin layouts.

10. A midplane assembly as in claim 3 wherein the first connector and the second connector are high-density, substantially block-shaped, electrical circuit board connectors.

11. A midplane assembly as in claim 10 wherein each of the first and second connectors is arranged to carry differential mode signals.

12. A midplane assembly as in claim 11 wherein the connecting sides of the first and second connectors have arrays of differential pairs arranged in multiple rows and multiple columns, the multiple rows having a pitch that is different than that of the multiple columns.

13. A midplane assembly as in claim 12 wherein each differential pair has a first pin and a second pin which are offset at a 45 degree angle to the multiple rows and multiple columns.

14. An electronic system, comprising:
a first circuit board module;
a second circuit board module; and
a midplane assembly arranged to interconnect the first circuit board module with the second circuit board module, the midplane assembly including:
a midplane having dielectric material and a set of plated through holes supported by the dielectric material, the dielectric material substantially defining a first side and a second side of the midplane, the set of plated through holes being arranged within the dielectric to form a first profile of plated through holes and a second profile of plated through holes, the first profile of plated through holes having (i) an overlapping portion which overlaps at least part of the second profile of plated through holes and (ii) a non-overlapping portion which does not overlap any part of the second profile of plated through holes,
a first connector mounted to the first side of the midplane over the first profile of plated through holes and arranged to connect with the first circuit board module, and
a second connector mounted to the second side of the midplane over the second profile formed by the set of plated through holes and arranged to connect with the second circuit board module,
at least one plated through hole of the set of plated through holes being a shared plated through hole which resides in both the first and second profiles and which engages a pin of the first connector and a pin of the second connector, and
at least one plated through hole of the set of plated through holes being a non-shared plated through hole which resides in the non-overlapping portion of the first profile and which engages a pin of the first connector without engaging any pins of the second connector.

15. An electronic system as in claim 14 wherein a shape of the first profile of plated through holes mirrors a shape of a connecting side of the first connector; and
wherein a shape of the second profile of plated through holes mirrors a shape of a connecting side of the second connector.

16. An electronic system as in claim 15 wherein the each of the first and second profiles is substantially rectangular in shape.

17. An electronic system as in claim 16 wherein at least one plated through hole of the set of plated through holes is a non-shared plated through hole which resides in both the first and second profiles and which engages a pin of the first connector without engaging any pins of the second connector; and
wherein at least one plated through hole of the set of plated through holes is a non-shared plated through hole which resides in both the first and second profiles and which engages a pin of the second connector without engaging any pins of the first connector.

18. An electronic system as in claim 16 wherein the first connector and the second connector are high-density, substantially block-shaped, electrical circuit board connectors; and
wherein each of the first and second connectors is arranged to carry differential mode signals.

19. An electronic system as in claim 18 wherein the connecting sides of the first and second connectors have arrays of differential pairs arranged in multiple rows and multiple columns, the multiple rows having a pitch that is different than that of the multiple columns.

20. An electronic system as in claim 19 wherein each differential pair has a first pin and a second pin which are offset at a 45 degree angle to the multiple rows and multiple columns.

21. A midplane assembly as in claim 1 wherein the first connector includes a first connector pin arranged to insert through a first end of a shared plated through hole of the midplane, and wherein the second connector includes a second connector pin arranged to insert through a second end of the shared plated through hole, the second end of the being opposite the first end,
the shared plated through hole conveying a signal between the first connector pin of the first connector and the second connector pin of the second connector when the first connector pin is inserted through the first end of the shared plated through hole and concurrently the second connector pin is inserted through the second end of the shared plated through hole.

22. A midplane assembly as in claim 21 wherein the first connector pin of the first connector and the second connector pin of the second connector are physically and electrically separated from each other prior to insertion into the shared plated through hole of the midplane.

23. An electronic system as in claim 14 wherein the first connector includes a first connector pin arranged to insert through a first end of a shared plated through hole of the midplane, and wherein the second connector includes a second connector pin arranged to insert through a second end of the shared plated through hole, the second end of the being opposite the first end,
the shared plated through hole conveying a signal between the first connector pin of the first connector and the second connector pin of the second connector when the first connector pin is inserted through the first end of the shared plated through hole and concurrently the second connector pin is inserted through the second end of the shared plated through hole.

24. An electronic system as in claim 23 wherein the first connector pin of the first connector and the second connector pin of the second connector are physically and electrically separated from each other prior to insertion into the shared plated through hole of the midplane.

25. An electronic system as in claim 19 wherein at least one of the first module and the second module is configured to exchange a differential mode signal through a differential pair of the differential pairs arranged in the multiple rows and the multiple columns, the multiple rows having the pitch that is different than that of the multiple columns.

* * * * *